United States Patent
Taguchi et al.

(10) Patent No.: US 6,633,620 B2
(45) Date of Patent: Oct. 14, 2003

(54) DATA RECEIVER CAPABLE OF INVALIDATING ERRONEOUS PULSES

(75) Inventors: Akihiro Taguchi, Kariya (JP); Hiroyuki Tsuji, Anjo (JP)

(73) Assignee: Denso Corporation, Kariya (JP)

( * ) Notice: Subject to any disclaimer, the term of this patent is extended or adjusted under 35 U.S.C. 154(b) by 103 days.

(21) Appl. No.: 10/001,810

(22) Filed: Dec. 5, 2001

(65) Prior Publication Data

US 2002/0084841 A1 Jul. 4, 2002

(30) Foreign Application Priority Data

Dec. 28, 2000 (JP) ........................................ 2000-402417
Oct. 19, 2001 (JP) ........................................ 2001-321948

(51) Int. Cl.[7] ............................................. B06C 23/00
(52) U.S. Cl. ........................ 375/360; 375/340; 340/445
(58) Field of Search ............................... 375/340, 360; 73/146, 146.2, 146.5, 146.8; 340/438, 442, 870.07, 445

(56) References Cited

U.S. PATENT DOCUMENTS 5,761,255 A * 6/1998 Shi ............................ 375/360
6,034,597 A * 3/2000 Normann et al. ........... 340/447
6,362,732 B1 * 3/2002 Konchin et al. ............ 340/466

FOREIGN PATENT DOCUMENTS

JP          A-5-227035          9/1993

* cited by examiner

Primary Examiner—Chi Pham
Assistant Examiner—Dung X. Nguyen
(74) Attorney, Agent, or Firm—Posz & Bethards, PLC

(57) ABSTRACT

In a data receiver, pulse edges are sequentially detected from the pulse string. If a pulse which has a width equal to two cycles of the reference clock signals is detected, bit data '1' is restored. If two consecutive pulses each of which has a width equal to one cycle are detected, bit data '0' is restored. If a pulse width between two consecutive pulse edges is not equal to one cycle or two cycles, it is presumed that a pulse edge of an erroneous pulse is detected. If the pulse width between the pulse edge, which is presumed to correspond to the erroneous pulse, and the next pulse edge is equal to or shorter than a predetermined threshold Th, the pulse edge and the next pulse edge is invalidated.

12 Claims, 6 Drawing Sheets

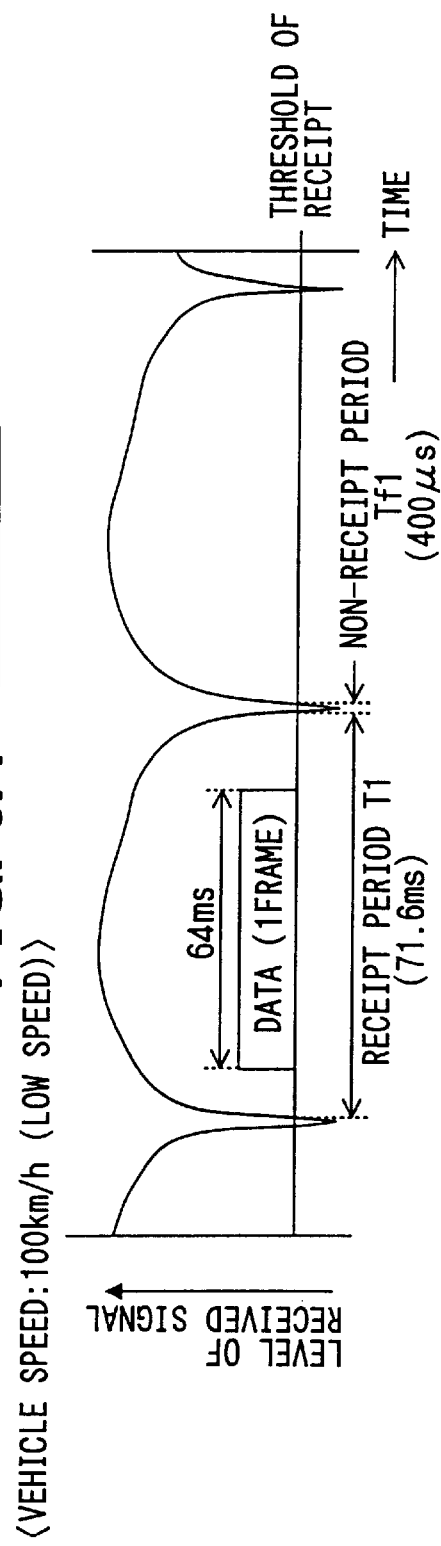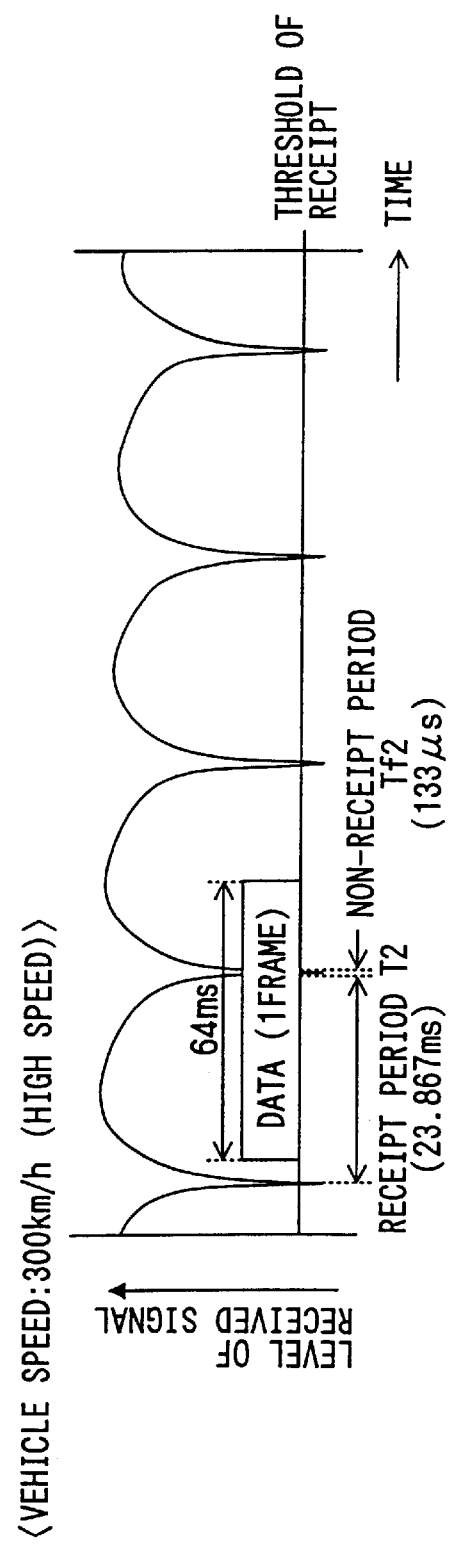

DATA RECEIVER CAPABLE OF INVALIDATING ERRONEOUS PULSES

CROSS REFERENCE TO RELATED APPLICATION

The present application relates to and incorporates herein by reference Japanese Patent Applications No. 2000-402417 filed on Dec. 28, 2000 and No. 2001-321948 filed on Oct. 19, 2001.

BACKGROUND OF THE INVENTION

1. Field of the Invention

The present invention relates to a data receiver for receiving data encoded employing predetermined encoding.

2. Related Art

Some of vehicles which employ pneumatic tires include a tire condition monitoring system for improving running safety. The tire condition monitoring system monitors the internal state of the tires. Specifically, in the tire condition monitoring system, tire condition warning devices incorporated inside the tires detect the air pressure in the tires or an abnormal condition therein, and then the detected information is transmitted to a data receiver installed in the vehicle body via radio waves.

The tire condition warning devices encode information on the tire pressure into binary data, and then carrier waves is modulated using the encoded information and transmitted to the data receiver. Various signal formats for representing binary data is known, and particularly a non-return-to-zero (NRZ) format or a differential bi-phase (DBP) format is known as a typical signal format for representing binary data. According to the NRZ format, each bit ('0' or '1') of binary data is represented by polarity. According to the DBP format, each bit of binary data is represented by presence or absence of a pulse edge synchronized with a reference clock signal, that is, it is represented by the pulse width between two pulse edges synchronized with regular reference clock signals.

The tire condition warning system usually employs DBP format, because each bit of the binary data can be obtained only by detecting pulse edges and pulse widths between two consecutive pulse edges from a pulse string. That is, the binary data can be restored from the pulse string without using clock signals in this case, while it is restored using clock signals in the case of synchronous communication or the like.

The tire condition monitoring system employs the data receiver for receiving the carrier waves modulated using a signal that represents the binary data in the DBP format from the tire condition warning devices. The data receiver detects and demodulates the received signal so that a pulse string which represents the binary data is extracted. Further the pulse edges and the pulse widths between two consecutive pulse edges are sequentially detected from the extracted pulse string, so that each bit of the binary data is restored. Thus the original binary data is restored from the received signal.

However, the data receiver sometimes obtains incorrect binary data as a result of restoration due to external noise or the like incorporated in the signals. The obtained binary data may be considerably incorrect when the condition (level of electromagnetic field) of the space through which the signals are transmitted to the data receiver is relatively poor. This problem is not limited to the transmission of the signals in the DBP format. That is, this problem usually arises when data is transmitted by cables or via radio waves.

Therefore, the data receiver usually eliminates the external noise using a hardware filter during detection and modulation of the received signal, so that components within a required frequency band (e.g., the frequency band of carrier waves which a transmitter modulates using the encoded binary data) are extracted.

Further, if the data receiver detects a pulse edge from the pulse string during the restoration of the binary data, it validates the detected pulse edge using a software twice-match filter. That is, the detected pulse edge is not validated immediately after it is detected. Specifically, the data receiver samples the pulse string according to predetermined reference clock signals. When the pulse edge is detected at a sampling time, the detected pulse edge is validated only if the same level is detected at the next sampling time. Thus, if an erroneous pulse whose width is shorter than the sampling interval is incorporated in the pulse string due to noise or the like, it is invalidated by the twice-match filter. As a result, the precision of the decoding is improved.

However, external noise within the required frequency band is not eliminated by the hardware filter. If the intensity of the external noise is relatively high, the noise is incorporated in the pulse string as an erroneous pulse.

If the erroneous pulse has a pulse width shorter than the sampling interval, it is eliminated by the twice-match filter even when it passes through the hardware filter. However, the sampling interval usually corresponds to the cycle of the reference clock incorporated in a microcomputer for operating its CPU. The cycle of the reference clock is very short (several microseconds), and therefore the erroneous pulse which has a very short width is only eliminated by the twice-match filter.

That is, an erroneous pulse which is within the required frequency band and has a width longer than the sampling interval is not eliminated, and therefore the edges of such an erroneous pulse is detected and validated. As a result, the original binary data is not accurately restored from the pulse string, and consequently a reception error occurs.

In the data receiver of the above tire condition monitoring system, the pulse string would include many erroneous pulses which cannot be eliminated by the software twice-match filter. The reason is as follows. The tire condition warning devices of the tire condition monitoring system are mounted inside the tires (on external surface of the wheels) as described above. Therefore, when the vehicle travels, the tire condition warning devices rotate as the tires rotate. On the other hand, the data receiver is fixed to the vehicle body, and therefore the level of the signals received by the data receiver constantly varies.

Particularly, the data receiver cannot receive the signals from the transmitter of the tire condition warning devices during a period (non-receipt period) whenever the tires make one rotation, because the level of the signals are low during the period due to an adverse effect of the directivity of antennas of the transmitter and the receiver. The null angle, which is a mechanical angle of the tires corresponding to the non-receipt period, varies depending on physical relationship between the antennas of the transmitter and the receiver, the power of the transmitted signals and the like. In the case of the tire condition monitoring system, it is known as a result of trail measurement that the null angle is several degrees.

When a vehicle, which has tires whose periphery is 2 meters long, travels at a speed of 100 km/h (low speed), the level of signals received by the data receiver varies as shown in FIG. 6A as the tires rotate. In this case, the tires make one rotation in 72 ms. Assuming the null angle is 2 degrees, the data receiver can receive signals during 71.6 ms (T1: receipt period) out of 72 ms, while it cannot receive signals during 400 µs (Tf1: non-receipt period) out of 72 ms. That is, the data receiver cannot receive signals during the non-receipt period Tf1 corresponding to the null angle whenever the tires make one rotation.

When the same vehicle travels at a speed of 300 km/h (high speed), the level of signals received by the data receiver varies as shown in FIG. 6B as the tires rotate. In this case, similarly to the case of the low-speed travel, the data receiver cannot receive signals during a period whenever the tires make one rotation. However, a receipt period T2 is 23.867 ms, and the non-receipt period Tf2 is 133 µs That is, both of the receipt period T2 and the non-receipt period Tf2 are shorter than the case of the low-speed travel, because the tires rotate at a high speed in this case.

Assuming that time required for receiving one frame of the binary data is 64 ms, the receipt of one frame can be completed within the receipt period T1 when the vehicle travels at the low speed. Further the data receiver repeatedly receives the same data several times, and obtains the correct data from the received data by majority. Therefore there is little possibility that the data receiver cannot obtain the correct data in the case of the low-speed travel, even if the data is received during a time including the non-receipt period Tf1 once or twice out of the several times.

However, in the case of the high-speed travel, the receipt of one frame cannot be completed within the receipt period T2. That is, the non-receipt period Tf2 absolutely comes during the receipt of one frame. The non-receipt period Tf2 is reflected in the pulse string as an erroneous pulse. The erroneous pulse cannot be eliminated by the software twice-match filter, because the width of the erroneous pulse is 133 µs, that is, longer than the sampling interval. As a result, the edge of the erroneous pulse is detected and validated, and consequently a reception error occurs.

The receipt period T1, T2 decreases as the traveling speed of the vehicle increases as described above. Accordingly, in order that the data receiver receives one frame within the receipt period when the vehicle travels at a high speed, the communication speed should be increased or the number of bits included in one frame should be decreased.

However, the reception sensitivity decreases as the communication speed increases. Further the number of bits included in one frame is necessarily determined depending on the number of bits at least required for representing information (e.g., tire pressure and temperature) communicated in the tire condition monitoring system. That is, the communication speed or the number of bits included in the frame is necessarily set to a certain value.

SUMMARY OF THE INVENTION

It is therefore an object of the present invention to provide a data receiver capable of accurately restoring binary data from a received signal modulated using a signal in which each bit of the binary data is represented by presence or absence of a pulse edge synchronized with a reference clock signal.

A data receiver according to the present invention includes receiver means, edge detection means, determination means, data restore means, and edge invalidation means. The receiver means receives a pulse string in which each bit of binary data is represented by a pulse width between two consecutive pulse edges synchronized with regular reference clock signals. The edge detection means sequentially detects a pulse edge from the pulse string. When a pulse edge is newly detected by the edge detection means, the determination means determines whether the pulse width between the preceding pulse edge and the newly detected present pulse edge is synchronized with the reference clock signals.

However, if the pulse width between the preceding pulse edge and the present pulse edge is shorter than one cycle of the reference clock signals, the edge invalidation means invalidates the present pulse edge so that the present pulse edge is not inputted to the determination means. When the determination means determines that the pulse width is synchronized with the reference clock signals, the data restore means determines next one bit of the binary data based on the pulse width. When the determination means determines that the pulse width is not synchronized with the reference clock signals, it is determined that a receipt error occurs, and data restore operation by the data restore means is stopped.

Preferably, the edge invalidation means includes pulse width detection means. The pulse width detection means detects the pulse width between the present pulse edge and the next pulse edge, when the pulse width between the preceding pulse edge and the present pulse edge is shorter than one cycle of the reference signals. If the pulse width detected by the pulse width detection means is equal to or shorter than a predetermined threshold which is shorter than one cycle of the reference signals, the invalidation means invalidates the present pulse edge and the next pulse edge so that the two pulse edges are not inputted to the determination means. If the pulse width detected by the pulse width detection means is longer than the predetermined threshold, it is determined that a receipt error occurs, and data restore operation by the data restore means is stopped.

BRIEF DESCRIPTION OF THE DRAWINGS

The invention, together with additional objects, features and advantages thereof, will be best understood from the following description, the appended claims and the accompanying drawings in which:

FIG. 6A is a graph showing variation in the level of signals received by the in-vehicle warning device when a vehicle travels at a speed of 100 km/h; and FIG. 6B is a graph showing variation in the level of signals received by the in-vehicle warning device when a vehicle travels at a speed of 300 km/h.

DETAILED DESCRIPTION OF THE PREFERRED EMBODIMENT

Figure 1:
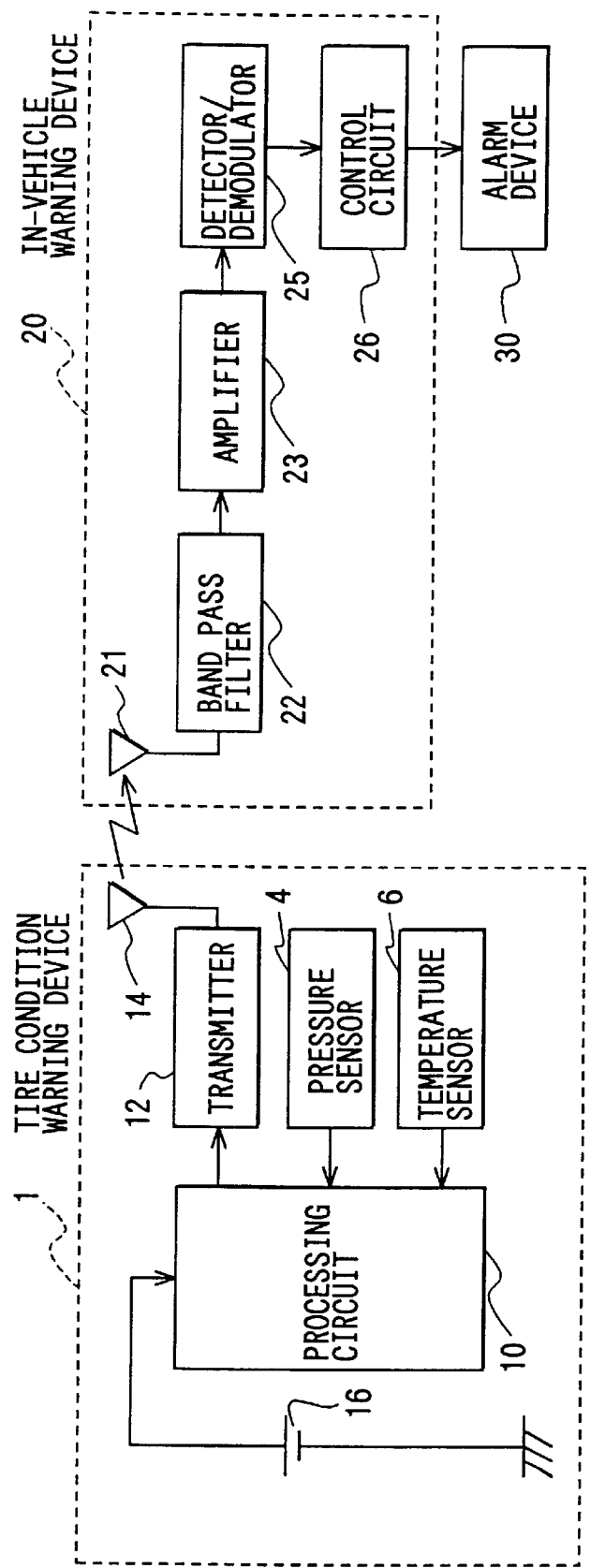
FIG. 1 is a block diagram of a tire condition monitoring system in which a data receiver according to an embodiment of the present invention is incorporated as an in-vehicle warning device.

A data receiver according to an embodiment of the present invention is incorporated in a tire condition monitoring system as an in-vehicle warning device 20 as shown in FIG. 1, and the tire condition monitoring system is incorporated in a vehicle. The tire condition monitoring system further includes tire condition warning devices 1 and an alarm device 30. The tire condition warning devices 1 are mounted inside the respective pneumatic tires of the vehicle. Mounting portions for the tire condition warning devices 1 are formed on the periphery of the wheels of the tires, and the tire condition warning devices 1 are mounted on the mounting portions.

The tire condition warning devices 1 detect the air pressure in the tires or an abnormal condition in the temperature of the tires. The in-vehicle warning device 20 is installed in the body of the vehicle, while the alarm device 30 is installed in the vehicle compartment. The tire condition warning devices 1 transmit an abnormal condition signal to the in-vehicle warning device 20 when the abnormal condition is detected in the tires. Then the in-vehicle warning device 20 instructs the alarm device 30 to raise an alarm corresponding to the received abnormal condition signal.

The tire condition warning devices 1 each include a pressure sensor 4, a temperature sensor 6, a processing circuit 10, a transmitter circuit 12, and a battery 16. The battery 16 supplies power for the processing circuit 10. The sensors 4, 6 are activated in response to drive signals from the processing circuit 10, and outputs sensor signals representing the tire pressure or the tire temperature to the processing circuit 10.

The processing circuit 10 detects an abnormal condition in the tire pressure or the tire temperature based on the sensor signals from the sensors 4, 6. In response to the detection of the abnormal condition, the processing circuit 10 activates the transmitter circuit 12, and outputs a signal that represents binary data, which represents the type of the detected abnormal condition, in the DBP format. Then the transmitter circuit 12 modulates carrier waves using the signal in the DBP format according to a predetermined modulation technique (ASK, FSK or the like), and transmits the resultant signal as an abnormal condition signal.

According to the DBP format, each bit of the binary data is represented by presence or absence of a pulse edge synchronized with a reference clock signal. The reference clock signals are generated at regular periods by a clock generator included in the processing circuit 10. Specifically, according to the DBP format employed by the present tire condition monitoring system, bit data '1' is represented by absence of a pulse edge during two cycles of the reference signals, that is, it is represented by a pulse which has a width of two cycles. On the other hand, bit data '0' is represented by presence of a pulse edge during two cycles of the reference signals, that is, it is represented by two pulses each of which has a width of one cycle. This means that the bit data length Tb, which is a time interval corresponding to one bit of the binary data, is two cycles of the reference clock signals.

On the other hand, the in-vehicle warning device 20 includes a receiving antenna 21, a bandpass filter 22 and an amplifier circuit 23. It further includes a detector/demodulator circuit 25 as receiver means. Further the in-vehicle warning device 20 includes a control circuit 26 as edge detection means, determination means, data restore means, and edge invalidation means. The receiving antenna 21 receives a signal (an abnormal condition signal) from the tire condition warning device 1. The received signals are passed through the bandpass filter 22, so that frequency component corresponding to the abnormal condition signal is extracted. The amplifier circuit 23 amplifies the extracted abnormal condition signal.

The detector/demodulator circuit 25 extracts a pulse string, which represents the type of the abnormal condition, from the amplified abnormal condition signal. The control circuit 26 receives the extracted pulse string, and restores the original binary data based on the pulse edges included in the pulse string. The control circuit 26 further determines the type of the abnormal condition (e.g., a drop in the tire pressure or a blowout) based on the restored binary data, and instructs the alarm device 30 to raise an alarm corresponding to the type of the abnormal condition.

The alarm device 30 is an alarm lamp mounted on the instrument panel in the vehicle compartment or audio equipment capable of outputting a sound via loudspeakers. The control circuit 26 is formed with a conventional microcomputer which includes a CPU, ROM, RAM, and an I/O subsystem, or a custom IC. The control circuit 26, in response to detection of abnormal tire condition based on the received data (binary data), turns the alarm lamp on or on and off, or outputs a warning sound (or a warning speech) corresponding to the type of the abnormal condition via the audio equipment. Thus occupant of the vehicle is informed of the abnormal tire condition.

In the control circuit 26, the CPU reads, from the ROM, a program for restoring the binary data, and executes the program so that the binary data is restored from the pulse string received from the detector/demodulator circuit 25. The program is executed when the signal inputted to the detector/demodulator circuit 25 is higher than a predetermined level, that is, when the abnormal condition signal is outputted from the tire condition warning devices 1.

Figure 2:
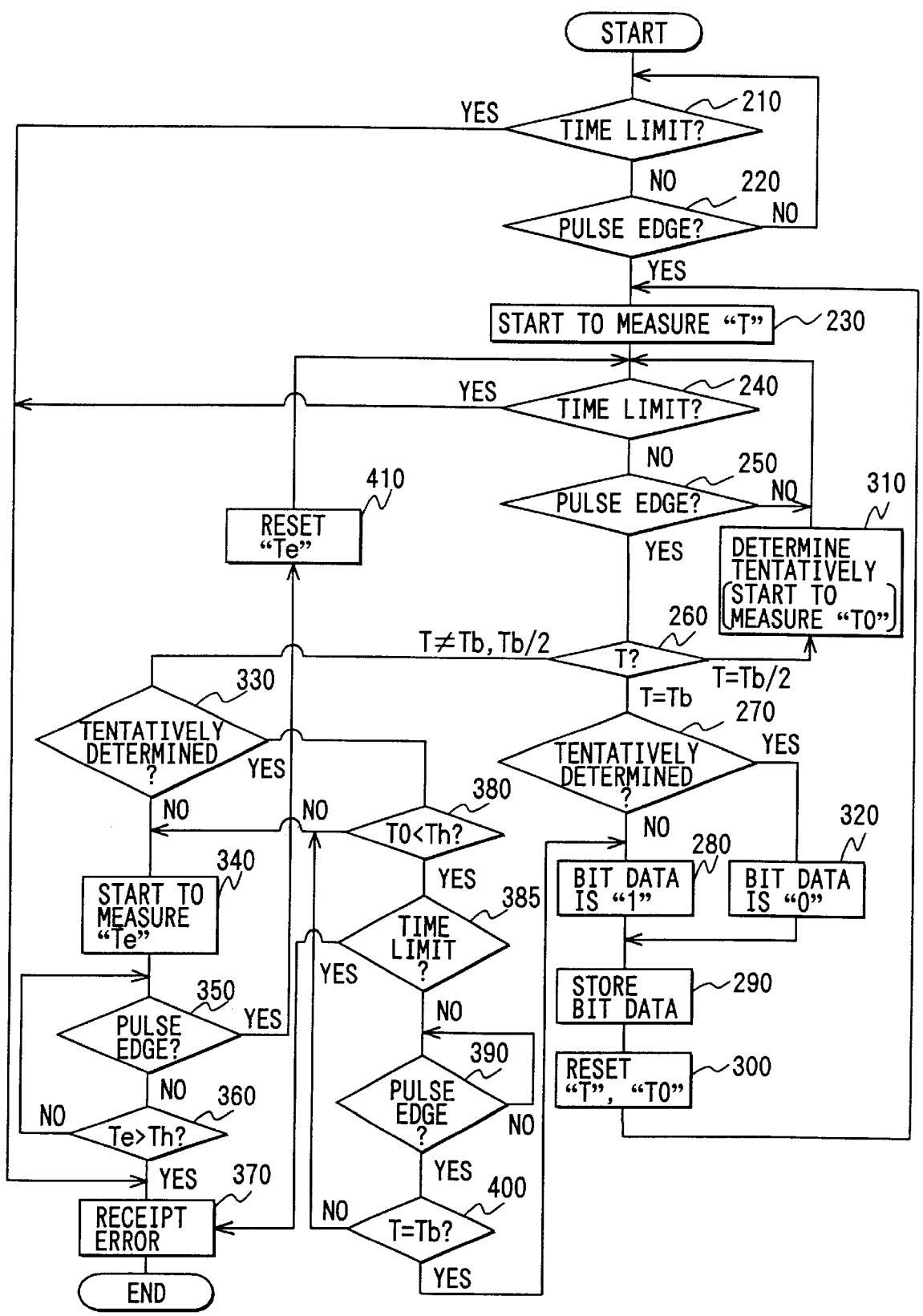
FIG. 2 is a flowchart of a process executed by the control circuit of the in-vehicle warning device according to the embodiment.

The binary data is restored as follows. Referring to FIG. 2, the process starts when the detector/demodulator circuit 25 begins to receive the abnormal condition signal, and it is determined at step 210 whether the time elapsed after the beginning of the receipt of the abnormal condition signals exceeds a first predetermined duration (e.g., two cycles of the reference clock signals). If the conclusion of step 210 is 'YES', it means that the time of the first predetermined duration elapses without detecting a pulse edge from the pulse string. Therefore the processing for a receipt error is executed at step 370, and thereafter the process terminates.

On the other hand, if the conclusion of step 210 is 'NO', it is determined at step 220 whether a pulse edge is detected from the pulse string. If the conclusion of step 220 is 'NO', the process returns to step 210, and steps 210, 220 are repeated until the time of the first predetermined duration elapses. If the conclusion of step 220 is 'YES', it means that a pulse edge is detected within the time of the first predetermined duration after the beginning of the receipt of the abnormal condition signal. Then measurement of the pulse width T is started at step 230. It is determined at step 240 whether the temporary pulse width T exceeds a second predetermined duration (e.g., two cycles of the reference signals).

If the conclusion of step 240 is 'YES', it means that the time of the second predetermined duration elapses without detecting a pulse edge after the pulse edge is previously detected. Therefore the processing for a receipt error is executed at step 370, and the process terminates. If the conclusion of step 240 is 'NO', it is further determined at step 250 whether a pulse edge is detected from the pulse string.

If the conclusion of step 250 is 'NO', the process returns to step 240, and steps 240, 250 are repeated until the time of the second predetermined duration elapses. If the conclusion of step 250 is 'YES', it is determined at step 260 whether the pulse width T, which is the duration of the time elapsed until the pulse edge is detected at step 250 after the beginning of the measurement at step 230, equals the bit data length Tb (two cycles of the reference clock signals) or equals to the half (one cycle of the reference signal) of the bit data length Tb.

If it is determined at step 260 that the pulse width T equals the half of the bit data length Tb, it means that a pulse of the width Tb/2 is detected. It is presumed that the detected pulse of width Tb/2 corresponds to the first pulse out of two pulses which together represent bit data '0'. Therefore it is tentatively determined at step 310 that the next bit is '0', and measurement of the pulse width T0 of the latter pulse is simultaneously started. Thereafter steps 240, 250 are repeated until the temporary pulse width T exceeds the second predetermined duration.

If it is determined at step 260 that the pulse width T equals the bit data length Tb, it means that a pulse of the width Tb is detected or that the latter pulse of the width Tb/2 is detected.

In the former case, it is determined at step 270 that it has not been tentatively determined that the next bit is '0', that is, conclusion of step 270 is 'NO'. Therefore the process moves to step 280, and it is conclusively determined at step 280 that the next bit is '1'.

In the latter case, it is determined at step 270 that it has been tentatively determined that the next bit is '0'. Therefore the process moves to step 320, and it is conclusively determined at step 320 that the next bit is '0'. The bit data determined at step 280 or 320 is stored in the RAM at step 290. Then the variables T, T0 corresponding to the pulse width and the latter half of the pulse width are reset at step 300. Thereafter the process returns to step 230, and repeats from step 230.

On the other hand, if the pulse width T is shorter than the half of the bit data length Tb at step 260, it is presumed that the detected pulse edge corresponds to an erroneous pulse. In this case, the process moves to step 330, and it is determined at step 330 that it has not been tentatively determined that the next bit is '0', that is, the conclusion of step 330 is 'NO'.

Then measurement of the width Te of the erroneous pulse is started at step 340. It is determined at step 350 whether the pulse edge is detected. If the conclusion of step 350 is 'NO', it is further determined at step 360 whether the width Te of the erroneous pulse exceeds a predetermined threshold Th. The threshold Th is set to a value equal to 33% of the bit data length Tb in the present embodiment. If the conclusion of step 360 is 'NO', the process returns to step 350, and steps 350, 360 are repeated. Thus step 350 is repeated until the width Te of the erroneous pulse reaches the predetermined threshold Th.

If it is determined at step 350 that a pulse edge is detected, that is, the conclusion of step 350 is 'YES', the width of the erroneous pulse Te is reset at step 410 and the process moves to step 240. Thus, the pulse edges detected at steps 250 and 350 corresponding to the erroneous pulse are ignored, if the width Te of the erroneous pulse is equal to or shorter than the threshold Th.

If the conclusion of step 360 is 'YES', it means that the width Te of the erroneous pulse is longer than the threshold Th. In this case, the processing for a receipt error is executed at step 370 and then the process terminates.

When the pulse width T is longer than the half of the bit data length Tb but shorter than the bit data length Tb at step 260, it is also presumed that the pulse edge detected at step 250 corresponds to an erroneous pulse. Therefore the process also moves to step 330 in this case, and further moves to step 340. Then the step 340 and the succeeding steps are performed similarly to the above case.

When it has been tentatively determined that the next bit is '0' at step 310 and thereafter a pulse edge is detected at step 250 before the pulse width T reaches the bit data length Tb, it also presumed that the detected pulse edge corresponds to an erroneous pulse. Therefore the process also moves from step 260 to step 330. In this case, it is determined at step 330 that it has been tentatively determined that the next bit is '0', that is, the conclusion of step 330 is 'YES'.

Accordingly the process moves to step 380, and it is determined at step 380 whether the width T0 of the latter pulse is shorter than the above threshold Th. If the conclusion of step 380 is 'YES', it is presumed that the pulse edge, which is detected at step 250 just when the pulse width T equals the half of the bit data length Tb, corresponds to an erroneous pulse. That is, it is presumed that it has been tentatively determined at step 310 by mistake that the next bit is '0'.

It is determined at step 385 whether the pulse width T exceeds a third predetermined duration (e.g., two cycles of the reference signals). If the conclusion of step 385 is 'YES', the processing for a receipt error is performed at step 370 and thereafter the process terminates. If the conclusion of step 385 is 'NO', it is further determined at step 390 whether a pulse edge is detected. Thus the detection of a pulse edge is continued until the pulse width T exceeds the third predetermined duration.

If it is determined at step 390 that a pulse edge is detected, it is further determined at step 400 whether the pulse width T equals the bit data length Tb. The conclusion of step 400 is 'YES', the process moves to step 280. Then it is conclusively determined at step 280 that the next bit is '1' and the succeeding steps are performed. If the conclusion of step 400 is 'NO', it is presumed that the pulse edge detected at step 390 corresponds to an erroneous pulse. Therefore the process moves to step 340, and step 340 and the succeeding steps are performed.

On the other hand, if the width T0 of the latter pulse is equal to or longer than the threshold Th, that is, the conclusion of step 380 is 'NO', it is presumed that the pulse edge, which is previously detected just when the pulse width T equals the half of the bit data length Tb, does not correspond to an erroneous pulse. That is, it is presumed that the determination at step 310 is not a mistake. Therefore it is presumed that the pulse edge detected at recent step 250 corresponds to an erroneous pulse. Accordingly the process moves to step 340, and step 340 and the succeeding steps are performed.

Thus the original binary data is restored. The processing at steps 220, 250, 350, 390 corresponds to the processing executed by edge detection means. The processing at step 260 corresponds to the processing executed by determination means. The processing at steps 280, 310, 320 corresponds to the processing executed by data restore means. Further the processing at steps 330–410 corresponds to the processing executed by edge invalidation means. Particularly, the processing at steps 360, 380 corresponds to the processing executed by the pulse width detection means of the edge invalidation means.

Figure 3A:
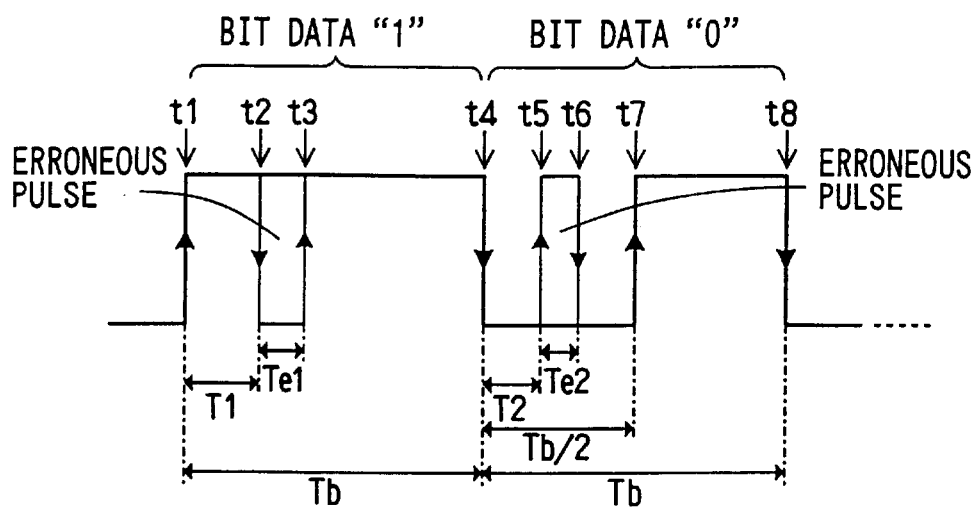
FIGS. 3A–3C are diagrams showing examples of a pulse string which includes erroneous pulses.

According to the above-described process, erroneous pulses, which have a width equal to or shorter than the predetermined threshold Th, can be ignored as follows. Referring to FIG. 3A, a pulse string includes a pulse corresponding to bit data '1' and another pulse corresponding to bit data '0' sequentially. The pulse corresponding to the bit data '1' includes a first erroneous pulse, while the pulse corresponding to the bit data '0' includes a second erroneous pulse. The rising edge of the pulse corresponding to bit data '1' is detected at step 220 at time t1, and then the measurement of the pulse width T is started at step 230.

Thereafter, when a time period T1 elapses, that is, when the pulse width T equals the time period T1, the falling edge of the first erroneous pulse is detected at step-250 at time t2. Assuming that the time period T1 is shorter than the half of the bit data length Tb, the process moves to step 330 and further moves to step 340. Then the measurement of the width Te of the first erroneous pulse is started at step 340. The rising edge of the first erroneous pulse is detected at step 350 at time t3, because the width Te1 of the first erroneous pulse is shorter than the threshold Th.

Then the process moves to step 410, so that the falling edge and the rising edge of the first erroneous pulse detected at the time t2 and t3 are both ignored. Thereafter the falling edge of the pulse corresponding to the bit data '1' is detected at step 250 at time t4. The process moves to step 270, because the pulse width T equals the bit data length Tb. Further the process moves to step 280, and it is conclusively determined that the bit data is '1'.

Similarly, the rising edge of the second erroneous pulse is detected at step 250 at time t5 and the falling edge of the second erroneous pulse is detected at step 350 at time t6, because the time period T2 between the time t4 and t5 is shorter than the half of the bit data length Tb and the width Te2 of the second erroneous pulse is shorter than the threshold Th. Then the process moves from step 350 to step 410, and then the detected edges are ignored.

Figure 3B:
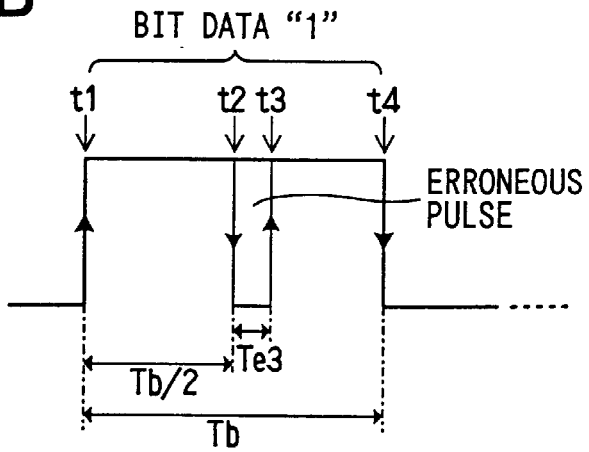

Referring to FIG. 3B, a pulse string includes a pulse corresponding to bit data '1', and the pulse includes an erroneous pulse. The rising edge of the pulse corresponding to the bit data '1' is detected at step 220 at time t1, and the falling edge of the erroneous pulse is detected at step 250 at time t2. The process moves to step 260 and further to step 310, because the time period between the time t1 and t2 equals the half of the bit data length Tb, that is, the pulse width T equals the half of the bit data length Tb.

Then it is tentatively determined at step 310 that the bit data is '0'. The rising edge of the erroneous pulse is detected at step 250 at time t3. Then the process moves to step 260 and further to step 330, because the pulse width Te3 of the erroneous pulse is shorter than the half of the bit data length Tb, that is, the pulse width T is longer than the half of the bit data length Tb but shorter than the bit data length Tb. The process further moves to step 380, because it has been tentatively determined at step 310 that the data bit is '0'.

The time T0 elapsed after the tentative determination at step 310 is shorter than the threshold Th, because the pulse width Te3 of the erroneous pulse is shorter than the threshold Th. Therefore the process moves from step 380 to step 385. This means that the tentative determination at step 310 is withdrawn. Thereafter the falling edge of the pulse corresponding to the bit data '1' is detected at step 390 at time t4. The process moves from step 400 to step 280, because the pulse width T equals the bit data length Tb. Then it is conclusively determined that the bit data is '1' at step 280.

Figure 3C:
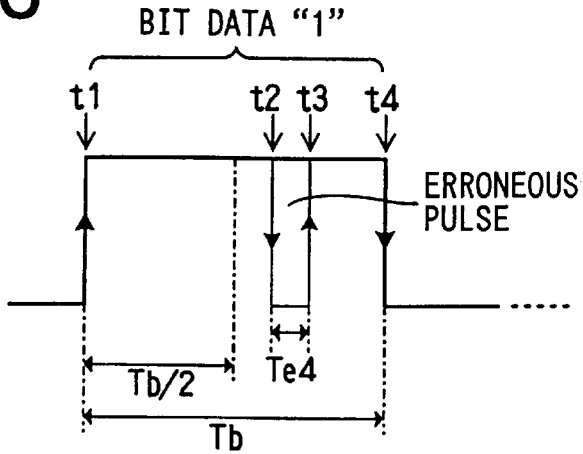

Referring to FIG. 3C, a pulse string also includes a pulse corresponding to bit data '1', and the pulse includes an erroneous pulse. The rising edge of the pulse corresponding to the bit data '1' is detected at step 220 at time t1, and thereafter the falling edge of the erroneous pulse is detected at step 250 at time t2. Then the process moves from step 260 to step 330, because the pulse width T is longer than the half of the bit data length Tb but shorter than the bit data length Tb. Further the process moves from step 330 to step 340, and then the measurement of the width Te of the erroneous pulse is started.

The rising edge of the erroneous pulse is detected at step 350 at time t3, because the width Te4 of the erroneous pulse is shorter than the threshold Th. The process moves to step 410, and then the detected edges of the erroneous pulse are ignored. Thereafter, the falling edge of the pulse corresponding to the bit data '1' is detected at step 250 at time t4. Then the process moves to step 260, because the pulse width T equals the bit data length Tb. The process further moves to step 280, because step 310 has been not performed. Then it is conclusively determined at step 280 that the bit data is '1'.

In this way, the control circuit 26 presumes that a pulse edge, which is not synchronized with a reference clock signal, corresponds to an erroneous pulse which is incorporated in the pulse string due to noise or the like. Then the control circuit 26 detects the next pulse edge, and the width between the first detected edge and the next detected edge. If the detected pulse width is shorter than the predetermined threshold Th, the control circuit 26 conclusively determines that the detected edges correspond to the erroneous pulse and then ignores the edges. Thus the control circuit 26 of the in-vehicle warning device 20 detects pulse edges and pulse widths from the pulse string invalidating erroneous pulses so that each bit of the binary data is accurately restored. As a result, the original binary data is accurately restored.

Accordingly, the adverse effect of erroneous pulses, which are incorporated in the pulse string due to external noise or reduced level of the received signals, is lowered. As a result, the binary data is accurately restored. Moreover, if a pulse edge which is not synchronized with a reference clock signal is detected, it is determined whether the detected pulse edge should be ignored further based on the width between the detected edge and the next edge. Thus, the erroneous pulses are more accurately identified, and consequently the original binary data is more accurately restored.

Accordingly, in the tire condition monitoring system employing the data receiver according to the present embodiment as the in-vehicle warning device 20, the abnormal condition signal transmitted from the tire condition warning devices 1 is more accurately restored and consequently the precision of the tire condition monitoring system is improved.

Figure 4:
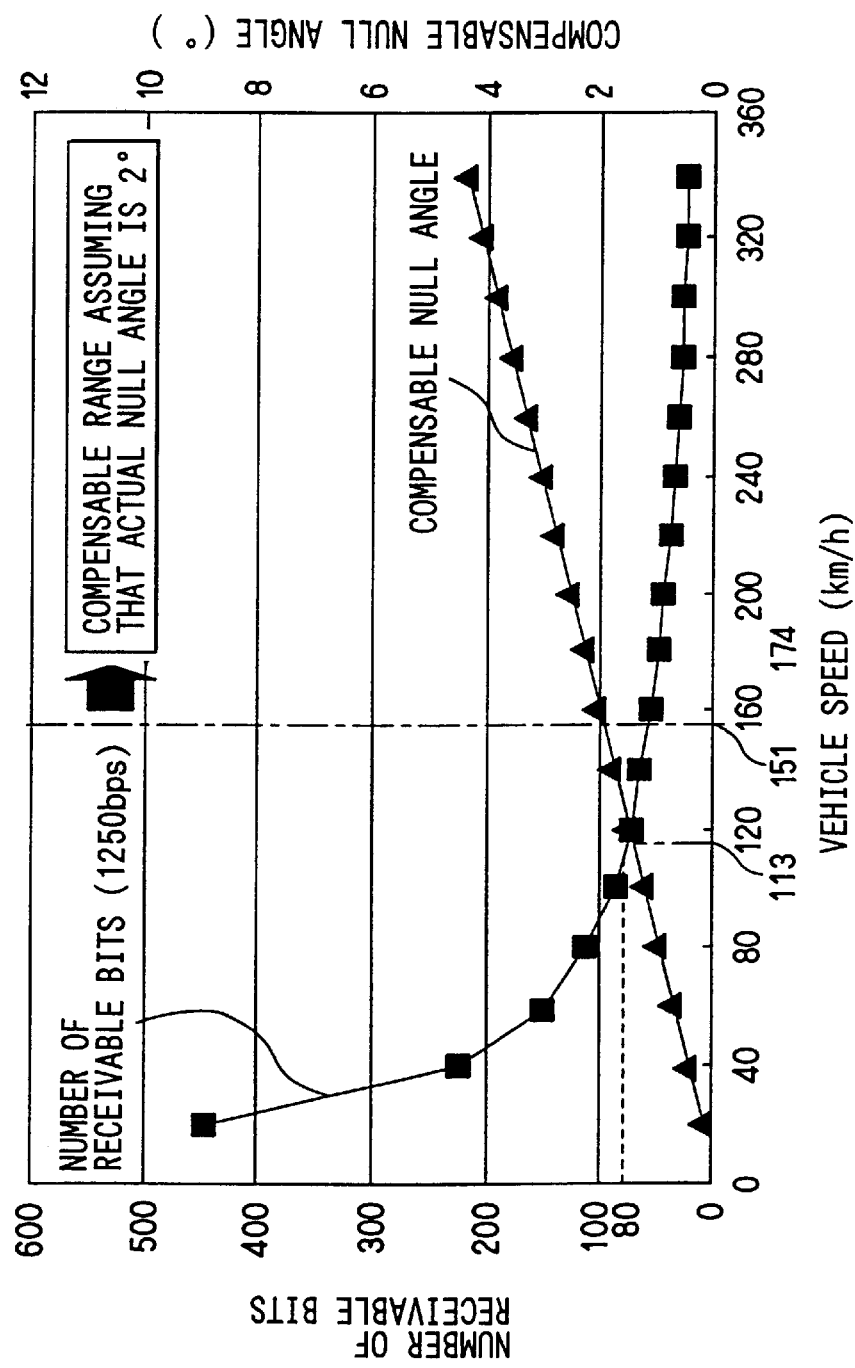
FIG. 4 is a graph showing the correspondence of the number of receivable bits per rotation to the vehicle speed and the correspondence of the maximum compensable null angle to the vehicle speed.

FIG. 4 shows the correspondence of the number of receivable bits per rotation to the vehicle speed assuming that the communication rate is 1250 bps, the periphery of the tires is 2 meters, the threshold Th is 264 ms, and the null angle is 2 degrees. The number of receivable bits means the maximum number of bits which can be received by the in-vehicle warning device 20 during the receipt-period (shown as T1 or T2 in FIG. 6) while the tires make one rotation.

FIG. 4 further shows the correspondence of a compensable null angle to the vehicle speed. The compensable null angle means the maximum null angle which can be compensated by the process shown in FIG. 2 so that erroneous pulses due to the null angle are not reflected in the restored binary data. Assuming that one frame of the binary data includes 80 bits, the binary data can be normally received by the in-vehicle warning device 20 without employing the data receiver of the present embodiment as the in-vehicle warning device 20, when the vehicle speed is equal to or lower than 113 km/h. This is because receipt of one frame of the binary data can be completed within the receipt-period.

However, the receipt of one frame of the binary data cannot be completed within the receipt-period, when the vehicle speed is higher than 113 km/h. In this case, assuming the actual null angle is 2 degrees, the binary data cannot be normally received even if the data receiver of the present invention is employed as the in-vehicle warning device 20, because the compensable null angle corresponding to the vehicle speed 113 km/h is lower than 2 degrees.

When the vehicle speed is higher than 151 km/h, the present data receiver can normally receive the binary data although the receipt of one frame cannot be completed within the receipt-period, because the compensable null angle is higher than 2 degrees.

Modifications

Figure 5:
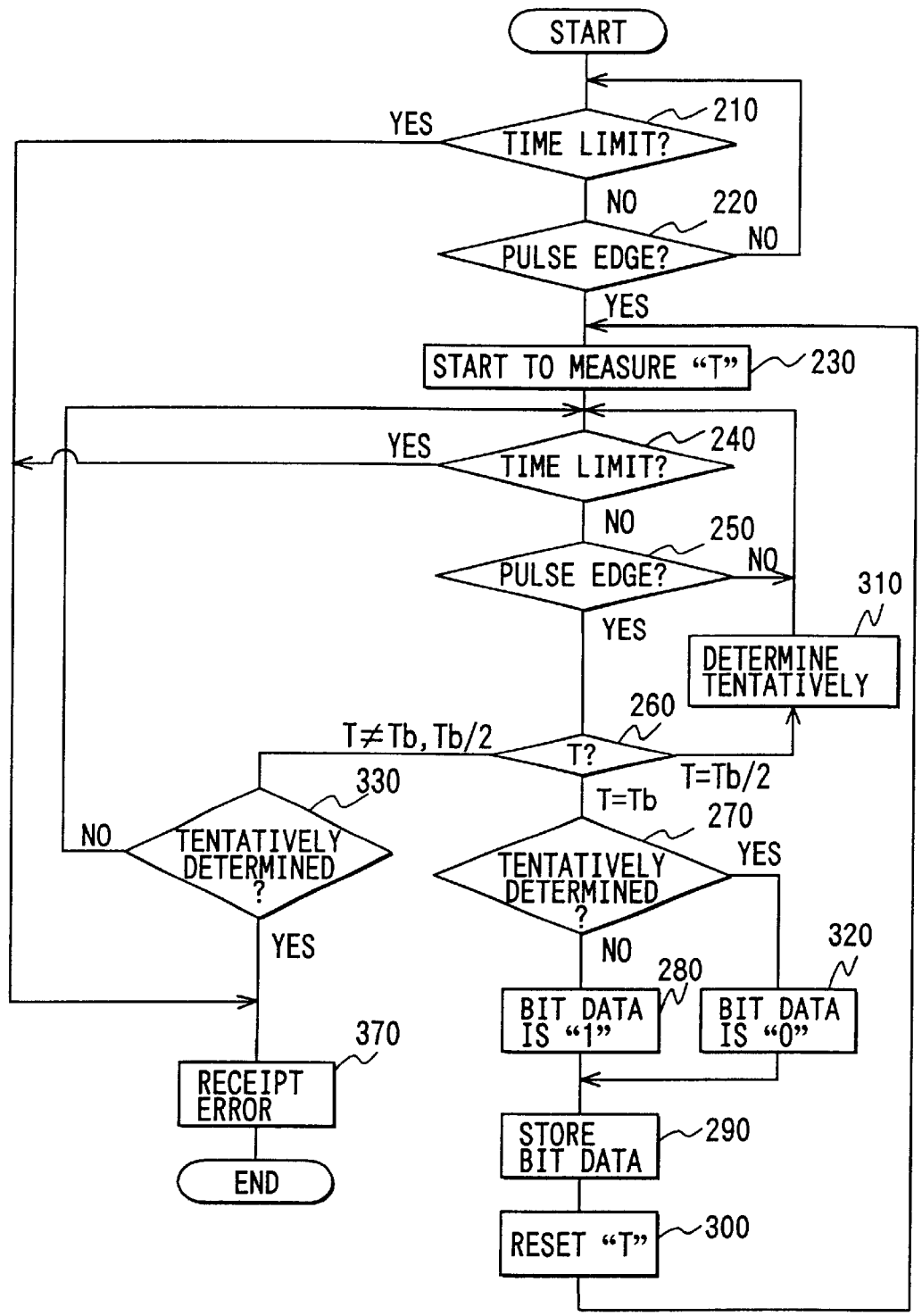
FIG. 5 is a flowchart of a process executed by the control circuit of the in-vehicle warning device according to a modification.

In the above embodiment, steps 340–360, 380–410 may be omitted, and further the process may move directly to step 370 when the conclusion of step 330 is 'YES' and return directly to step 240 when the conclusion of step 330 is 'NO' as shown in FIG. 5. In this case, when a pulse edge which is not synchronized with a reference clock signal is detected at step 250, that is, it is presumed that the detected pulse edge corresponds to an erroneous pulse, the pulse edge is immediately invalidated and ignored without measuring the width Te of the erroneous pulse.

Further in this case, if a pulse edge which is not synchronized with a reference clock signal is detected at step 250 after it has been tentatively determined at step 310 that the next bit data is '0', the processing for a receipt error is executed at step 370 without detecting the next pulse edge and thereafter the process terminates.

According to the present modification, erroneous pulses, which occur when the pulse width T is not equal to the bit data length Tb or the half of the bit data length Tb as shown in FIG. 3A or 3C, can be ignored. However, if an erroneous pulse occurs when the pulse width T is equal to the half of the bit data length T, the process moves to step 370 in response to the detection of the rising edge of the erroneous pulse at time t3 and thereafter terminates, because it has been tentatively determined at step 330 that the next data bit is '0' in response to the detection of the falling edge of the erroneous pulse at time t2, Further in the above embodiment, steps 330, 380–400 may be omitted. In this case, the process may move from step 260 directly to step 340 only when the pulse width T is shorter than the half of the bit data length Tb. When the pulse width T is longer than the half of the bit data length Tb but shorter than the bit data length Tb at step 260, the process moves to step 370. Then the processing for a receipt error is performed, and thereafter the process terminates.

In this case, erroneous pulses, which occur when the pulse width T is shorter than the half of the bit data length Tb, can be invalidated and ignored. However, if an erroneous pulse occurs when the pulse width T is longer than the half of the bit data length Tb but shorter than the bit data length Tb, a receipt error occurs. If no erroneous pulse occurs when the pulse width T is longer than the half of the bit data length Tb but shorter than the bit data length Tb, the bit data is accurately restored without misrecognizing a pulse edge corresponding to a pulse which represents the bit data as a pulse edge corresponding to an erroneous pulse.

According to the above modifications, the control circuit 26 can be simplified so that a pulse edge which is synchronized with a reference clock signal is not misrecognized as the edge of an erroneous pulse.

In the above embodiment and modifications, a signal format other than the DBP format may be employed as long as each bit of the binary data is represented by presence or absence of pulse edges synchronized with reference clock signals. For example, a PPM format or a PWM format may be employed.

The data receiver of the present invention may be incorporated in a system other than the tire condition monitoring system. For example, the data receiver may be incorporated in a keyless entry system as an in-vehicle receiver.

The present invention is not limited to the above embodiment and modifications, but may be variously embodied within the scope of the invention.

What is claimed is:

1. A data receiver comprising:
   receiver means for receiving a pulse string in which each bit of binary data is represented by a pulse width between two consecutive pulse edges synchronized with regular reference clock signals;
   edge detection means for sequentially detecting a pulse edge from said pulse string;
   determination means for determining whether a pulse width between the preceding pulse edge and the present pulse edge is synchronized with the reference clock signals when the present pulse edge is newly detected by said edge detection means;
   edge invalidation means for invalidating the present pulse edge so that the present pulse edge is not inputted to said determination means when said pulse width is shorter than one cycle of reference clock signals; and
   data restore means for restoring said binary data by determining each bit of said binary data based on said pulse width when said determination means determines that said pulse width is synchronized with the reference clock signals,
   wherein, when said determination means determines that said pulse width is not synchronized with the reference clock signals, it is determined that a receipt error occurs, and data restore operation by said data restore means is stopped.

2. A data receiver as in claim 1,
   wherein said edge invalidation means is activated only when a time elapsed after said data restore means newly determines one bit of said binary data is shorter than one cycle of the reference signals.

3. A data receiver as in claim 1,
   wherein said edge invalidation means comprises pulse width detection means which detects a pulse width between the present pulse edge and a next pulse edge when said pulse width between the preceding pulse edge and the present pulse edge is shorter than one cycle of the reference signals, and
   wherein, when the pulse width detected by said pulse width detection means is equal to or shorter than a predetermined threshold which is shorter than one cycle of the reference signals, said invalidation means invalidates the present pulse edge and the next pulse edge so that the present pulse edge and the next pulse edge are not inputted to said determination means.

4. A data receiver as in claim 3,
   wherein, when the pulse width detected by said pulse width detection means is longer than said predetermined threshold, it is determined that a receipt error occurs, and data restore operation by said data restore means is stopped.

5. A data receiver as in claim 1,
wherein, if the pulse width between the preceding pulse edge and the present pulse edge is longer than one cycle of the reference signals but shorter than two cycle of the reference signals, edge invalidation means invalidates the present pulse edge so that the present pulse edge is not inputted to said determination means.

6. A data receiver for restoring binary data from a pulse string comprising:
receiver means for receiving a pulse string in which each bit of the binary data is represented by a pulse width between two consecutive pulse edges synchronized with regular reference clock signals;
edge detection means for sequentially detecting a pulse edge from said pulse string;
determination means for determining whether a first pulse width between first two consecutive pulse edges coincides with one of valid pulse widths which represent a bit of the binary data;
data restore means for restoring the binary data by determining each bit of the binary data based on the first pulse width if said determination means determines that the first pulse width coincides with one of the valid pulse widths;
edge invalidation means for invalidating latter of second two consecutive pulse-edges so that said determination means ignores the latter of the second consecutive pulse edges if it is determined that a second pulse width between the second consecutive pulse edges exceeds a predetermined threshold shorter than one cycle of the reference signals and does not coincide with one of the valid pulse widths and a third pulse width between former of the second consecutive pulse edges and a previous pulse edge, which is detected by said edge detection means immediately before the former of the second consecutive pulse edges and is not invalidated by said edge invalidation means, coincides with one of the valid pulse widths; and
restore stop means for stopping the restoration of the binary data if said determination means determines that the first pulse width does not coincide with one of the valid pulse widths.

7. A data receiver as in claim 6,
wherein said edge invalidation means is activated only when a time elapsed after a pulse edge, which is not invalidated by said edge invalidation means, is detected by said edge detection means is shorter than one cycle of the reference clock signals.

8. A data receiver as in claim 6,
wherein, when it is determined that the second pulse width exceeds the predetermined threshold and does not coincide with one of the valid pulse widths and the third pulse width coincides with one of the valid pulse widths, said edge invalidation means invalidates both of the latter of the second consecutive edges and a next pulse edge which is detected by said edge detection means immediately after the latter of the second consecutive pulse edges if it is determined a pulse width between the latter of the second consecutive pulse edges and the next pulse edge is equal to or shorter than the predetermined threshold.

9. A method for restoring binary data from a pulse string in which each bit of the binary data is represented by a pulse width between two consecutive pulse edges synchronized with regular reference clock signals, the method comprising the steps of:
detecting a pulse edge sequentially from the pulse string;
determining whether a first pulse width between first two consecutive pulse edges coincides with one of valid pulse widths which represent a bit of the binary data;
restoring the binary data by determining each bit of the binary data based on the first pulse width if it is determined that the first pulse width coincides with one of the valid pulse widths at said determining step;
invalidating latter of second two consecutive pulse edges so that the latter of the second consecutive pulse edges is ignored at said determining step if it is determined that a second pulse width between the second consecutive pulse edges exceeds a predetermined threshold shorter than one cycle of the reference signals and does not coincide with one of the valid pulse widths and a third pulse width between former of the second consecutive pulse edges and a previous pulse edge, which is detected at said detecting step immediately before the former of the second consecutive pulse edges and is not invalidated at said invalidating step, coincides with one of the valid pulse widths; and
stopping the restoration of the binary data if it is determined that the first pulse width does not coincide with one of the valid pulse widths at said determining step.

10. A method as in claim 9,
wherein said invalidating step is performed only when a time elapsed after a pulse edge, which is not invalidated at said invalidating step, is detected at said detecting step is shorter than one cycle of the reference clock signals.

11. A method as in claim 9,
wherein, when it is determined that the second pulse width exceeds the predetermined threshold and does not coincide with one of the valid pulse widths and the third pulse width coincides with one of the valid widths, both of latter of the second consecutive edges and a next pulse edge, which is detected at said detecting step immediately after the latter of the second consecutive pulse edges, are invalidated at said invalidating step if it is determined a pulse width between the latter of the second consecutive pulse edges and the next pulse edge is equal to or shorter than the predetermined threshold.

12. A tire condition monitoring system for monitoring an air pressure in tires of a vehicle, comprising:
transmitter means incorporated in the tires for generating a signal by modulating a predetermined carrier wave using a pulse string in which each bit of binary data that represents the air pressure in the tires is represented by a pulse width between two consecutive pulse edges synchronized with regular reference clock signals, said transmitter means transmitting the generated signal; and
a data receiver for receiving the signal from said transmitter means and restoring said binary data from said received signal, said data receiver comprising:
receiver means for demodulating the received signal so that said pulse string is extracted;
edge detection means for sequentially detecting a pulse edge from said pulse string;
determination means for determining whether a pulse width between the preceding pulse edge and the present pulse edge is synchronized with reference clock signals when the present pulse edge is newly detected by said edge detection means; and data restore means for restoring said binary data by determining each bit of said binary data based on said pulse width when said determination means determines that said pulse width is synchronized with the reference clock signal, wherein, when said determination means determines that said pulse width is not synchronized with the reference clock signals, it is determined that an receipt error occurs, and data restore operation by said data restore means is stopped, and wherein said data receiver further comprises edge invalidation means for invalidating the present pulse edge so that the present pulse edge is not inputted to said determination means when said pulse width is shorter than one cycle of reference clock signals.

* * * * *